United States Patent
Yang

(10) Patent No.: US 7,078,986 B2
(45) Date of Patent: Jul. 18, 2006

(54) SYMMETRICAL POLYPHASE NETWORK

(75) Inventor: Tony Yang, Irvine, CA (US)

(73) Assignee: Wionics Research, Irvine, CA (US)

( * ) Notice: Subject to any disclaimer, the term of this patent is extended or adjusted under 35 U.S.C. 154(b) by 20 days.

(21) Appl. No.: 10/711,311

(22) Filed: Sep. 9, 2004

(65) Prior Publication Data

US 2005/0174196 A1 Aug. 11, 2005

Related U.S. Application Data

(60) Provisional application No. 60/521,035, filed on Feb. 10, 2004.

(51) Int. Cl.
*H03H 7/21* (2006.01)
(52) U.S. Cl. ........................ 333/172; 333/168
(58) Field of Classification Search ................ 333/168, 333/172, 109, 110, 116, 117
See application file for complete search history.

(56) References Cited

U.S. PATENT DOCUMENTS 3,559,042 A 1/1971 Gingell
4,326,109 A * 4/1982 McGee et al. ............... 379/402
4,618,831 A * 10/1986 Egami et al. ............ 330/124 R
5,280,292 A * 1/1994 Tondryk ...................... 342/373
6,388,543 B1 * 5/2002 Molnar et al. ............... 333/172

* cited by examiner

*Primary Examiner*—Seungsook Ham

(74) *Attorney, Agent, or Firm*—Winston Hsu

(57) ABSTRACT

First, second, third, and fourth resistors are coupled to first, second, third, and fourth capacitors. A first positive in-phase terminal is coupled to the first resistor and the first capacitor. A first negative in-phase terminal is coupled to the fourth resistor and the fourth capacitor. A positive quadrature-phase terminal is coupled to the second resistor and the first capacitor. A second positive in-phase terminal is coupled to the first resistor and the second capacitor. A second negative in-phase terminal is coupled to the fourth resistor and the third capacitor. A negative quadrature-phase terminal is coupled to the third resistor and the fourth capacitor. The first and fourth resistors, the second and third resistors, the first and fourth capacitors, and the second and third capacitors are equal distances from and on a same side of respective axes, and are equal distances from and on opposite sides of a symmetry axis.

19 Claims, 6 Drawing Sheets

SYMMETRICAL POLYPHASE NETWORK

CROSS REFERENCE TO RELATED APPLICATIONS

This application claims the benefit of the filing date of U.S. provisional patent application No. 60/521,035, filed Feb. 10, 2004 and entitled "Image Rejection Mixer", the contents of which are hereby incorporated by reference.

BACKGROUND OF INVENTION

1. Field of the Invention

The invention relates to electronic circuits, and more particularly, to symmetrical polyphase networks.

2. Description of the Prior Art

As is well known to a person of ordinary skill in the art, symmetrical polyphase networks (PPN), or in a filtering context, polyphase networks (PPFs), have multiple usages in electronic circuit design. Generally speaking, symmetrical PPNs perform the same function as two separate resistor/capacitor (RC) networks, but are much less sensitive to component tolerances. In U.S. Pat. No. 3,559,042, which is incorporated herein by reference, Gingell discloses a symmetrical polyphase network (PPN).

FIG. 1 shows a conventional layout diagram of a 3-stage symmetrical PPN 100 according to Gingell's disclosure. The PPN 100 includes three stages 102, 104, 106 having resistors and capacitors coupled together in the same manner. As can been seen from FIG. 1, when viewed strictly from an electrical perspective, the PPN 100 has a symmetrical structure. In each stage 102, 104, 106, each node of the PPN 100 has connections to both a resistor and a capacitor. However, when viewed in conjunction with a physical layout structure perspective, such PPN is not symmetrical. As frequency increases, these connections between the resistors and capacitors have a greater and greater influence on the symmetrical nature of the design. More specifically, as frequency increases, the structure shown in FIG. 1 becomes less and less symmetrical. This is due to the fact that the connections themselves begin to influence the design. The symmetrical PPN 100 is typically implemented on a multilayer substrate and vias are used in connection 108 to traverse the different layers. For example, in the first stage 102, in order to allow a connection 108 from capacitor $C_{A4}$ to cross over multiple connections and couple to $R_{A1}$, a minimum of two vias are used in connection 108 to traverse to a different layer, cross the multiple connections, and return to the original layer to couple to $R_{A1}$. Hence, the length and number of vias in connection 108 are different than the length and number of vias in the other connections. At high frequencies, both the vias and the connections themselves have relatively significant resistance and capacitance properties. Therefore, at high frequencies, the operational efficiency of the PPN 100 becomes more dependent on the component values and is negatively influenced by the component layout and connection paths. A conventional solution to these problems is to use multiple stages, such as the three stages 102, 104, 106 shown in FIG. 1. By slightly varying the component values between each of the stages to overlap the frequency response of each stage at a selected frequency, the circuit designer can ensure the PPN 100 will correctly operate at the selected frequency. However, using multiple stages increases the component count, the cost, and the complexity of the design of the PPN 100.

SUMMARY OF INVENTION

One objective of the claimed invention is therefore to provide a symmetrical polyphase network having a symmetrical layout.

According to an embodiment of the invention, a polyphase network is disclosed. The polyphase network comprises first, second, third, and fourth impedances of a first type; first, second, third, and fourth impedances of a second type; a first positive in-phase terminal coupled to a first end of the first impedance of the first type and a first end of the first impedance of the second type using a first connection; a first negative in-phase terminal coupled to a second end of the fourth impedance of the first type and a second end of the fourth impedance of the second type using a second connection; a second positive quadrature-phase terminal coupled to a first end of the second impedance of the first type and a second end of the first impedance of the second type using a third connection; a second positive in-phase terminal coupled to a second end of the first impedance of the first type and a first end of the second impedance of the second type using a fourth connection; a second negative in-phase terminal coupled to a first end of the fourth impedance of the first type and a second end of the third impedance of the second type using a fifth connection; and a second negative quadrature-phase terminal coupled to a second end of the third impedance of the first type and a first end of the fourth impedance of the second type using a sixth connection; wherein the first and fourth impedances of the first type are substantially equal distances from and on a same side of a first axis, and are substantially equal distances from and on opposite sides of a symmetry axis; the second and third impedances of the first type are substantially equal distances from and on a same side of the first axis, and are substantially equal distances from and on opposite sides of the symmetry axis; the first and fourth impedances of the second type are substantially equal distances from and on a same side of a second axis, and are substantially equal distances from and on opposite sides of the symmetry axis; and the second and third impedances of the second type are substantially equal distances from and on a same side of the second axis, and are substantially equal distances from and on opposite sides of the symmetry axis.

According to another embodiment of the invention, a polyphase network is also disclosed. The polyphase network comprises a first impedance of a first type; a second impedance of the first type; a third impedance of the first type; a fourth impedance of the first type; a first impedance of a second type; a second impedance of the second type; a third impedance of the second type; a fourth impedance of the second type; a first connection coupled between a first end of the first impedance of the first type and a first end of the first impedance of the second type; a second connection coupled between a second end of the fourth impedance of the first type and a second end of the fourth impedance of the second type; a seventh connection coupled between a second end of the second impedance of the first type and a first end of the third impedance of the second type; an eighth connection coupled between a first end of the third impedance of the first type and a second end of the second impedance of the second type; a third connection coupled between a first end of the second impedance of the first type and a second end of the first impedance of the second type; a fourth connection coupled between a second end of the first impedance of the first type and a first end of the second impedance of the second type; a fifth connection coupled between a first end of the fourth impedance of the first type and a second end of the third impedance of the second type; and a sixth connection coupled between a second end of the third impedance of the first type and a first end of the fourth impedance of the second type; wherein the third connection crosses the fourth connection, the fifth connection crosses the sixth connection, and the seventh connection crosses the eighth connection.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
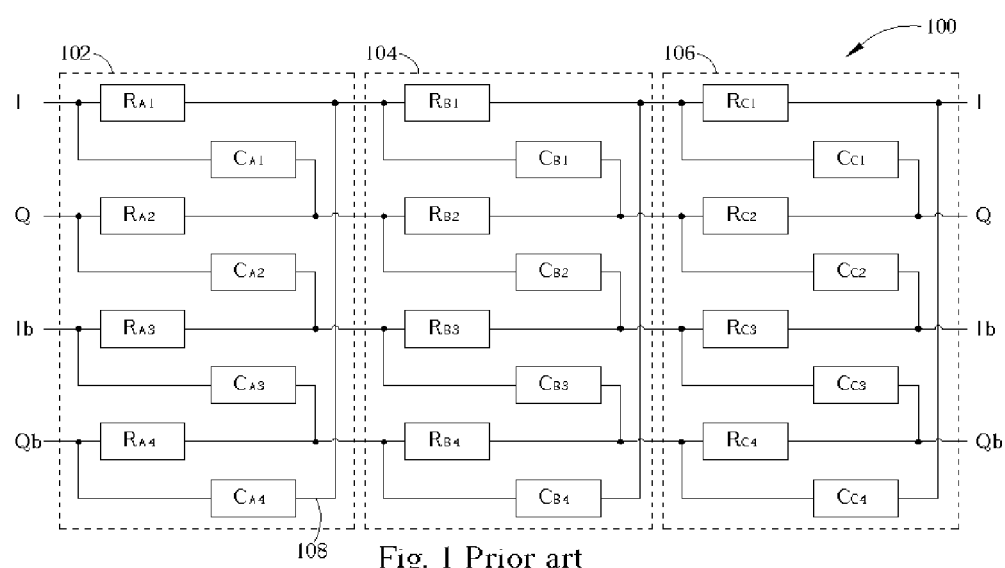
FIG. 1 is a layout diagram of a conventional 3-stage symmetrical PPN.
Figure 2:
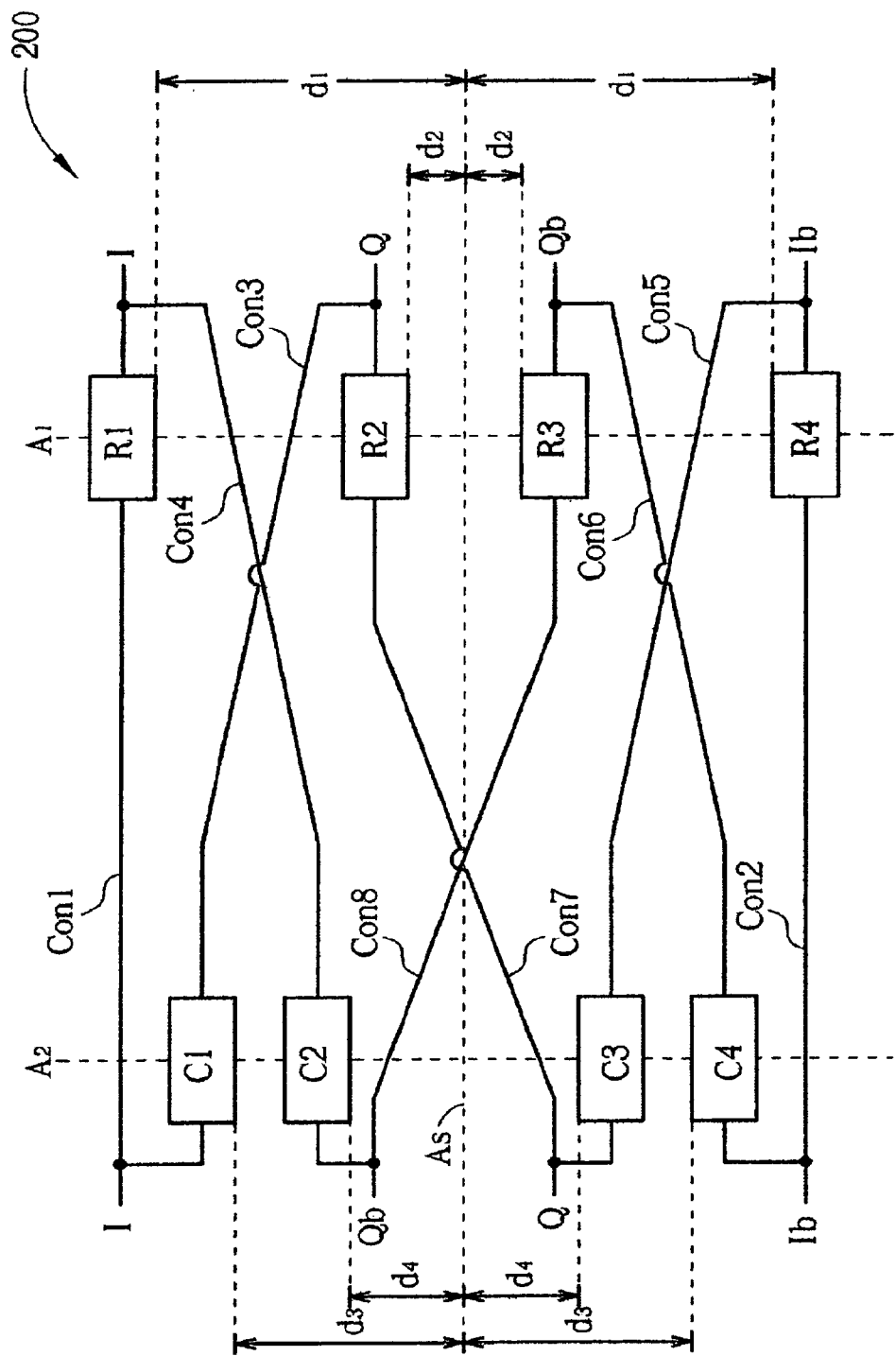
FIG. 2 is a layout diagram of a single-stage symmetrical PPN according to a first embodiment of the present invention.
Figure 3:
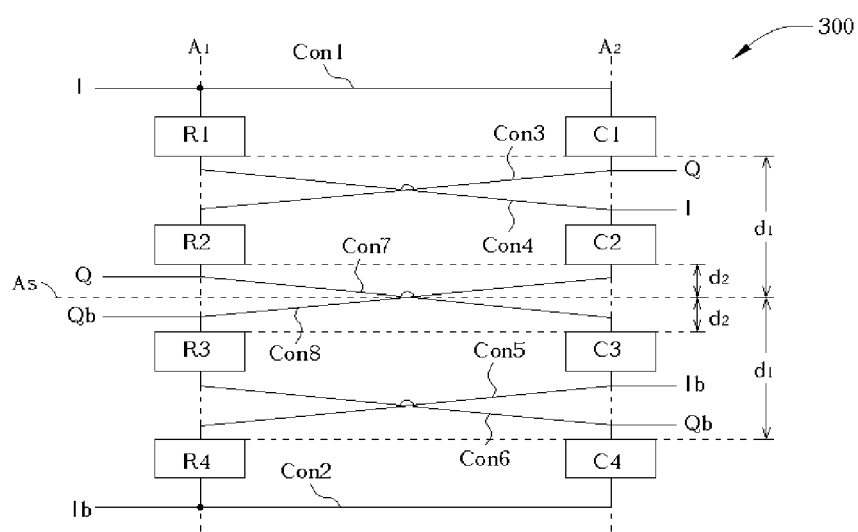
FIG. 3 is a layout diagram of a single-stage symmetrical PPN according to a second embodiment of the present invention.
Figure 4:
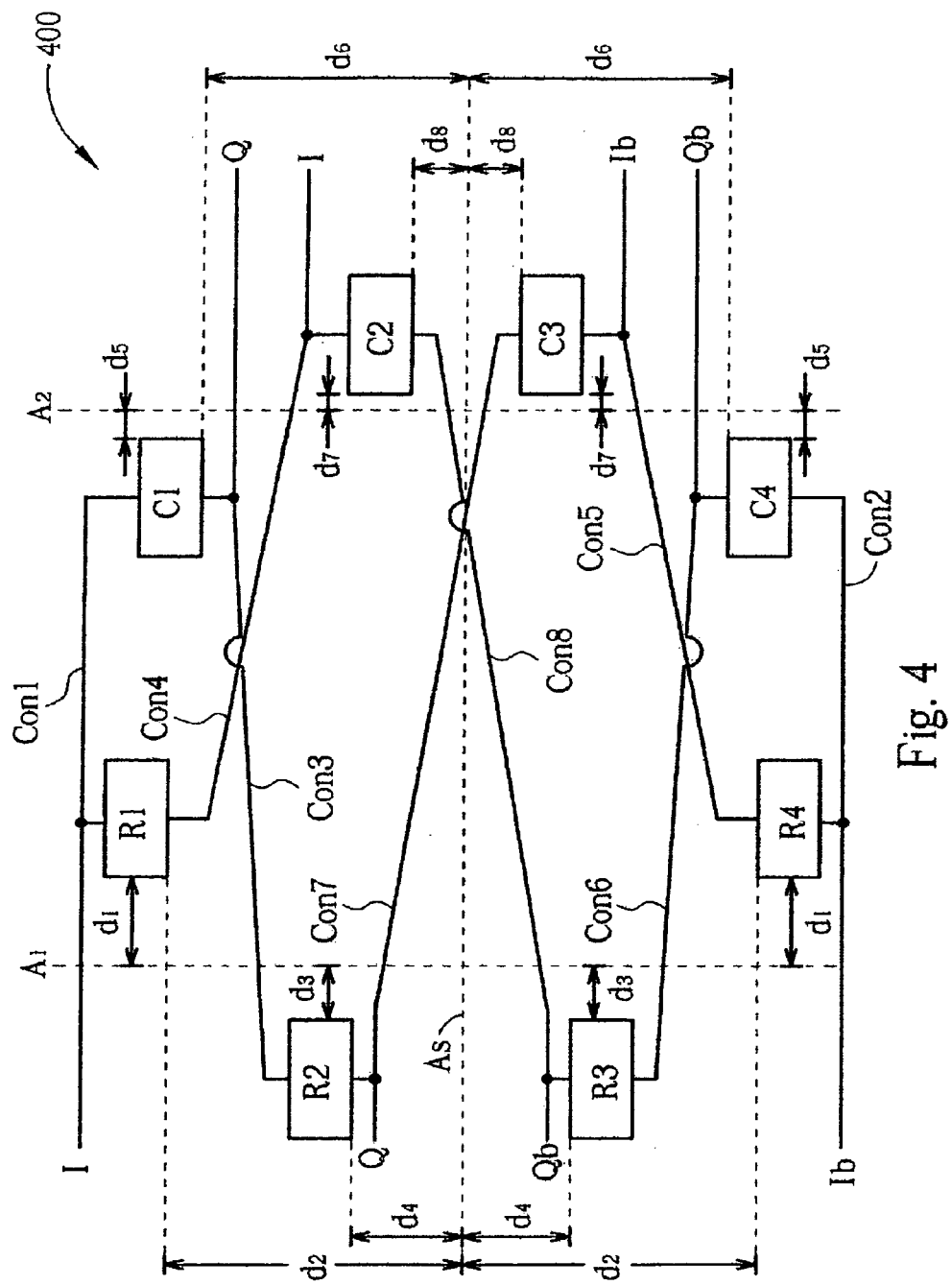
FIG. 4 is a layout diagram of a single-stage symmetrical PPN according to a third embodiment of the present invention.

FIG. 2, FIG. 3, and FIG. 4 show layout diagrams of single-stage symmetrical PPNs 200, 300, 400 according to different embodiments of the present invention. In each layout, the symmetrical PPN 200, 300, 400 includes first, second, third, and fourth resistors (R1–R4) having substantially the same resistance arranged sequentially along a first axis $A_1$; first, second, third, and fourth capacitors (C1–C4) having substantially the same capacitance arranged sequentially along a second axis $A_2$ adjacent to the first axis $A_1$; an incoming positive in-phase terminal I coupled to a first end of the first resistor R1 and a first end of the first capacitor C1 using a first connection Con1; an incoming negative in-phase terminal Ib coupled to a second end of the fourth resistor R4 and a second end of the fourth capacitor C4 using a second connection Con2; an incoming positive quadrature-phase terminal Q coupled to a second end of the second resistor R2 and a first end of the third capacitor C3 using a seventh connection Con7; an incoming negative quadrature-phase terminal Qb coupled to a first end of the third resistor R3 and a second end of the second capacitor C2 using an eighth connection Con8; an outgoing positive quadrature-phase terminal Q coupled to a first end of the second resistor R2 and a second end of the first capacitor C1 using a third connection Con3; an outgoing positive in-phase terminal I coupled to a second end of the first resistor R1 and a first end of the second capacitor C2 using a fourth connection Con4; an outgoing negative in-phase terminal Ib coupled to a first end of the fourth resistor R4 and a second end of the third capacitor C3 using a fifth connection Con5; and an outgoing negative quadrature-phase terminal Qb coupled to a second end of the third resistor R3 and a first end of the fourth capacitor C4 using a sixth connection Con6.

The resistors (R1–R4) and the capacitors (C1–C4) are positioned symmetrically according to embodiments of the present invention. More specifically, the first axis $A_1$ is adjacent and substantially parallel with the second axis $A_2$. Additionally, there is a symmetry axis $A_S$ passing through the center of the layout substantially perpendicular to the first axis $A_1$ and the second axis $A_2$. The distances of the resistors (R1–R4) and the capacitors (C1–C4) are controlled according to the symmetry axis $A_S$. Therefore the lengths of the connections between the components are controlled to be symmetrical about the symmetry axis $A_S$.

Figure 5:
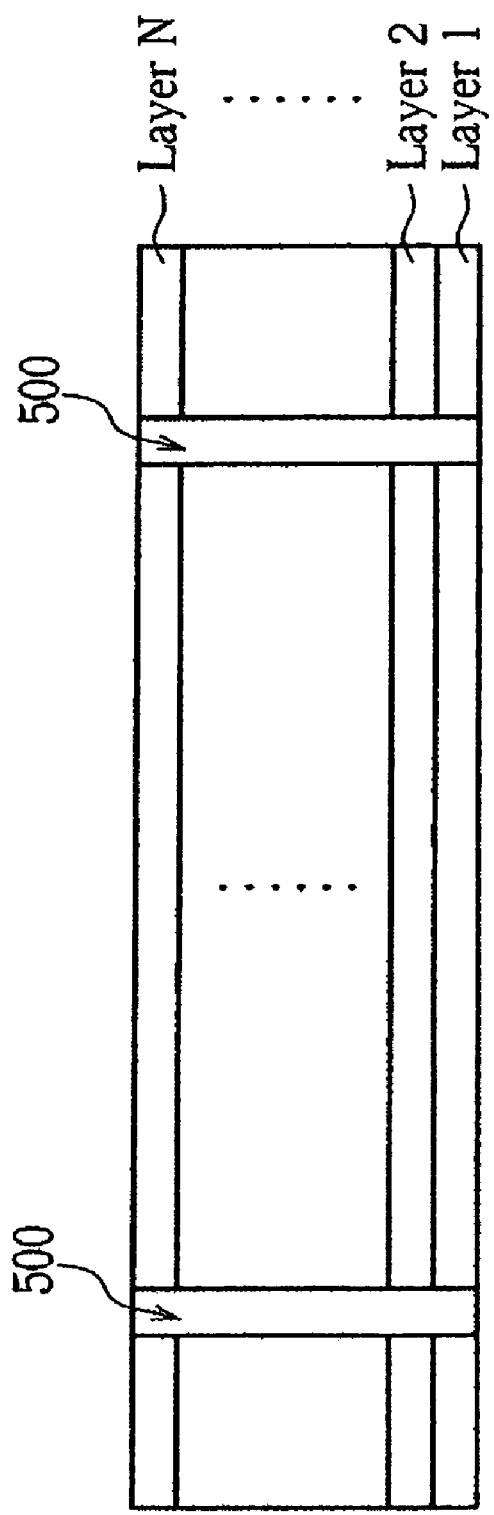
FIG. 5 shows the polyphase network being implemented on a substrate having a plurality of layers, and the connections use vias to traverse the layers.
Figure 6:
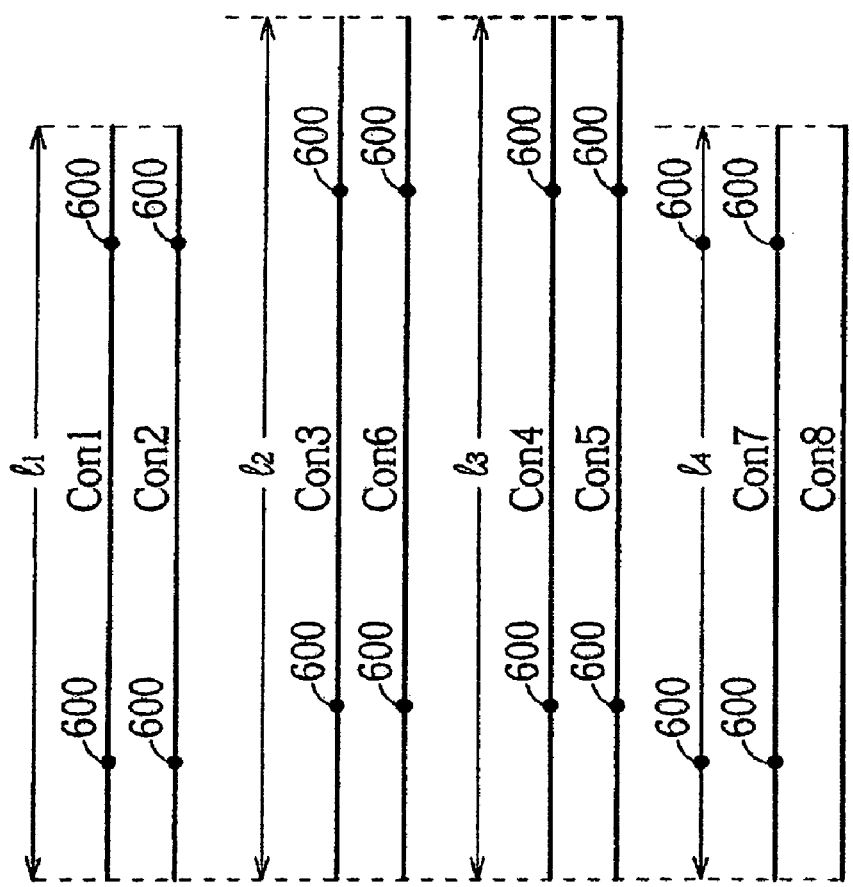
FIG. 6 shows the first and second connections having substantially equivalent lengths and number of vias, the third and sixth connections having substantially equivalent lengths and number of vias, the fourth and fifth connections having substantially equivalent lengths and number of vias, and the seventh and eighth connections having substantially equivalent lengths and number of vias.

According to a first embodiment of the present invention, as shown in FIG. 2, the resistors (R1–R4) and the capacitors (C1–C4) each has a first end and a second end, which are horizontally oriented, and are aligned on the first axis A1 and the second axis A2, respectively. The first and fourth resistors Ri, R4 are substantially equal distances d1 from and on opposite sides of the symmetry axis AS. The second and third resistors R2, R3 are substantially equal distances d2 from and on opposite sides of the symmetry axis AS. The first and fourth capacitors C1, C4 are substantially equal distances d3 from and on opposite sides of the symmetry axis AS. The second and third capacitors C2, C3 are substantially equal distances d4 from and on opposite sides of the symmetry axis AS. As shown in FIG. 5, in order to allow the connections (Con1–Con8) to cross one another, the symmetrical PPN 200 is implemented on a substrate having a plurality of layers (Layer 1 to Layer N), and the connections (Con1–Con8) use vias 500 to traverse the layers. As shown in FIG. 6, to ensure symmetry about the symmetry axis AS, the first and second connections Con1, Con2 have substantially equivalent lengths 11 and number of vias 600, the third and sixth connections Con3, Con6 have substantially equivalent lengths 12 and number of vias 600, the fourth and fifth connections Con4, Con5 have substantially equivalent lengths 13 and number of vias 600, and the seventh and eighth connections Con7, Con5 have substantially equivalent lengths 14 and number of vias 600.

According to a second embodiment of the present invention, as shown in FIG. 3, the resistors (R1–R4) and the capacitors (C1–C4) each has a first end and a second end, which are vertically oriented, and are aligned on the first axis $A_1$ and the second axis $A_2$, respectively. The first and fourth resistors R1, R4 and the first and fourth capacitors C1, C4 are substantially equal distances $d_1$ from and on opposite sides of the symmetry axis $A_S$. The second and third resistors R2, R3 and the second and third capacitors C2, C3 are substantially equal distances $d_2$ from and on opposite sides of the symmetry axis $A_S$. The symmetrical PPN 200 is implemented on a substrate having a plurality of layers, and the connections (Con1–Con8) use vias (not shown) to traverse the layers. Again, to ensure symmetry about the symmetry axis $A_S$, the first and second connections Con1, Con2 have substantially equivalent lengths and number of vias, the third and sixth connections Con3, Con6 have substantially equivalent lengths and number of vias, the fourth and fifth connections Con4, Con5 have substantially equivalent lengths and number of vias, and the seventh and eighth connections Con7, Con8 have substantially equivalent lengths and number of vias.

According to a third embodiment of the present invention, as shown in FIG. 4, the resistors (R1–R4) and the capacitors (C1–C4) each has a first end and a second end, which are vertically oriented, and are aligned along the first axis $A_1$ and the second axis $A_2$, respectively. The first and fourth resistors R1, R4 are substantially equal distances $d_1$ from and on a same side of the first axis $A_1$. They are also substantially equal distances $d_2$ from and on opposite sides of the symmetry axis $A_S$. The second and third resistors R2, R3 are substantially equal distances $d_3$ from and on a same side of the first axis $A_1$. They are also substantially equal distances $d_4$ from and on opposite sides of the symmetry axis $A_S$. The first and fourth capacitors C1, C4 are substantially equal distances $d_5$ from and on a same side of the second axis $A_2$. They are also substantially equal distances $d_6$ from and on opposite sides of the symmetry axis $A_S$. The second and third capacitors C2, C3 are substantially equal distances $d_7$ from and on a same side of the second axis $A_2$. They are also substantially equal distances $d_8$ from and on opposite sides of the symmetry axis $A_S$. The symmetrical PPN 300 is implemented on a substrate having a plurality of layers, and the connections (Con1–Con8) use vias (not shown) to traverse the layers. Again, to ensure symmetry about the symmetry axis $A_S$, the first and second connections Con1, Con2 have substantially equivalent lengths and number of vias, the third and sixth connections Con3, Con6 have substantially equivalent lengths and number of vias, the fourth and fifth connections Con4, Con5 have substantially equivalent lengths and number of vias, and the seventh and eighth connections Con7, Con8 have substantially equivalent lengths and number of vias.

It should be noted that the present invention is not limited to the embodiments shown above. For example, as will be recognized by a person of ordinary skill in the art, the above-mentioned incoming and outgoing terminals (I, Q, Ib, Qb) could be reversed; i.e., the incoming terminals could also be used as the outgoing terminals, and vice versa. In another embodiment, the PPN may have the incoming positive quadrature terminal Q and the incoming negative quadrature terminal Qb shorted together. Additionally, in other embodiments, the location of the capacitors (C1–C4) and the location of the resistors (R1–R4) are swapped. In fact, the present invention is not limited to using resistors and capacitors as the two components. In other embodiments, the resistors (R1–R4) are replaced with impedances of a first type, and the capacitors (C1–C4) are replaced with impedances of a second type. As long as a first phase angle characteristic of the first impedance type is different than a second phase angle characteristic of the second impedance type, the resulting PPN according to the present invention will be symmetrical at both low and high frequencies. It should also be noted that single-stage PPNs could be cascaded together to form multiple-stage PPNs. For multiple stage PPNs, it may be necessary to further cross some of the output terminals while maintaining the symmetrical layout of the present invention. For example, in FIG. 2, the outgoing positive quadrature-phase terminal Q and the outgoing negative-phase terminal Qb could use equal number of vias to cross each other to ensure the order of the incoming terminals (I, Q, Qb, Ib) matches the order of the outgoing terminals (I, Q, Qb, Ib). Similar adjustments of order of the outgoing (or incoming) terminals could be made in other embodiments as well.

The disclosed PPN according to the present invention is symmetrical at both low and high frequencies. Because impedances of the first type (R1–R4) and the impedances of the second type (C1–C4) are positioned symmetrically along a first axis $A_1$ and a second axis $A_2$, respectively, the impedances of the first type are coupled to the impedances of the second type using symmetrical connections (Con1–Con8). The connections (Con1–Con8) are symmetrical about the symmetry axis $A_S$. When the symmetrical PPN 300 is implemented on a substrate having a plurality of layers, and the connections (Con1–Con8) use vias (not shown) to traverse the layers, the symmetry of the connections about the symmetry axis AS is as aforementained. As a result, at high frequencies where the connections (Con1–Con8) themselves begin to influence the design, any change of the impedance values of the connections (Con1–Con8) will be equivalent between differential pairs of the PPN. In this way, the impedance changes of the connections (Con1–Con8) cancel each other and the operational efficiency and center frequency of the frequency response of the PPN is directly controllable by the component values. Therefore, using the present invention, it becomes possible to accurately tune the frequency response of a single-stage PPN at a selected center frequency.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A polyphase network comprising:
   first, second, third, and fourth impedances of a first type;
   first, second, third, and fourth impedances of a second type;
   a first positive in-phase terminal coupled to a first end of the first impedance of the first type and a first end of the first impedance of the second type using a first connection;
   a first negative in-phase terminal coupled to a second end of the fourth impedance of the first type and a second end of the fourth impedance of the second type using a second connection;
   a second positive quadrature-phase terminal coupled to a first end of the second impedance of the first type and a second end of the first impedance of the second type using a third connection;
   a second positive in-phase terminal coupled to a second end of the first impedance of the first type and a first end of the second impedance of the second type using a fourth connection;
   a second negative in-phase terminal coupled to a first end of the fourth impedance of the first type and a second end of the third impedance of the second type using a fifth connection; and
   a second negative quadrature-phase terminal coupled to a second end of the third impedance of the first type and a first end of the fourth impedance of the second type using a sixth connection;
   wherein the first and fourth impedances of the first type are substantially equal distances from and on a same side of a first axis, and are substantially equal distances from and on opposite sides of a symmetry axis;
   the second and third impedances of the first type are substantially equal distances from and on a same side of the first axis, and are substantially equal distances from and on opposite sides of the symmetry axis;
   the first and fourth impedances of the second type are substantially equal distances from and on a same side of a second axis, and are substantially equal distances from and on opposite sides of the symmetry axis; and
   the second and third impedances of the second type are substantially equal distances from and on a same side of the second axis, and are substantially equal distances from and on opposite sides of the symmetry axis.

2. The polyphase network of claim 1, wherein the first axis is adjacent and substantially parallel with the second axis.

3. The polyphase network of claim 2, wherein the symmetry axis is substantially perpendicular to the first axis and the second axis.

4. The polyphase network of claim 1, further comprising:
a first positive quadrature-phase input terminal coupled to a second end of the second impedance of the first type and a first end of the third impedance of the second type using a seventh connection; and
a first negative quadrature-phase input terminal coupled to a first end of the third impedance of the first type and a second end of the second impedance of the second type using an eighth connection.

5. The polyphase network of claim 4, wherein the polyphase network is implemented on a substrate having a plurality of layers, and the connections use vias to traverse the layers.

6. The polyphase network of claim 5, wherein the first and second connections have substantially equivalent lengths and number of vias, the third and sixth connections have substantially equivalent lengths and number of vias, the fourth and fifth connections have substantially equivalent lengths and number of vias, and the seventh and eighth connections have substantially equivalent lengths and number of vias.

7. The polyphase network of claim 1, wherein:
a second end of the second impedance of the first type is coupled to a first end of the third impedance of the second type using a seventh connection;
a first end of the third impedance of the first type is coupled to a second end of the second impedance of the second type using an eighth connection; and
the seventh connection is coupled to the eighth connection.

8. The polyphase network of claim 7, wherein the polyphase network is implemented on a substrate having a plurality of layers, and the connections use vias to traverse the layers.

9. The polyphase network of claim 8, wherein the first and second connections have substantially equivalent lengths and number of vias, the third and sixth connections have substantially equivalent lengths and number of vias, the fourth and fifth connections have substantially equivalent lengths and number of vias, and the seventh and eighth connections have substantially equivalent lengths and number of vias.

10. The polyphase network of claim 1, wherein the impedances of the first type have a phase angle characteristic different than the phase angle characteristic of the impedances of the second type.

11. The polyphase network of claim 10, wherein the impedances of the first type are resistors and the impedances of the second type are capacitors, or the impedances of the first type are capacitors and the impedances of the second type are resistors.

12. The polyphase network of claim 11, wherein the resistors have substantially equivalent resistance and the capacitors have substantially equivalent capacitance.

13. A polyphase network comprising:
a first impedance of a first type;
a second impedance of the first type;
a third impedance of the first type;
a fourth impedance of the first type;
a first impedance of a second type;
a second impedance of the second type;
a third impedance of the second type;
a fourth impedance of the second type;
a first connection coupled between a first end of the first impedance of the first type and a first end of the first impedance of the second type;
a second connection coupled between a second end of the fourth impedance of the first type and a second end of the fourth impedance of the second type;
a seventh connection coupled between a second end of the second impedance of the first type and a first end of the third impedance of the second type;
an eighth connection coupled between a first end of the third impedance of the first type and a second end of the second impedance of the second type;
a third connection coupled between a first end of the second impedance of the first type and a second end of the first impedance of the second type;
a fourth connection coupled between a second end of the first impedance of the first type and a first end of the second impedance of the second type;
a fifth connection coupled between a first end of the fourth impedance of the first type and a second end of the third impedance of the second type; and
a sixth connection coupled between a second end of the third impedance of the first type and a first end of the fourth impedance of the second type;
wherein the third connection crosses the fourth connection, the fifth connection crosses the sixth connection, and the seventh connection crosses the eighth connection.

14. The polyphase network of claim 13, wherein the resistors have substantially equivalent resistance and the capacitors have substantially equivalent capacitance.

15. The polyphase network of claim 1, being positioned on a substrate having a physical layout wherein:
the first and fourth impedances of the first type are substantially equal distances from and on a same side of the first axis, and are substantially equal distances from and on opposite sides of the symmetry axis;
the second and third impedances of the first type are substantially equal distances from and on a same side of the first axis, and are substantially equal distances from and on opposite sides of the symmetry axis;
the first and fourth impedances of the second type are substantially equal distances from and on a same side of the second axis, and are substantially equal distances from and on opposite sides of the symmetry axis; and
the second and third impedances of the second type are substantially equal distances from and on a same side of the second axis, and are substantially equal distances from and on opposite sides of the symmetry axis.

16. The polyphase network of claim 1, wherein the first, second, third, and fourth impedances of the first type each have a first impedance value; the first, second, third, and fourth impedances of the second type each have a second impedance value; and the first impedance value is different than the second impedance value.

17. The polyphase network of claim 1, wherein the first, second, third, and fourth impedances of the first type each have a first phase angle characteristic; the first, second, third, and fourth impedances of the second type each have a second phase angle characteristic; and the first phase angle characteristic is different than the second phase angle characteristic.

18. The polyphase network of claim 13, wherein the first, second, third, and fourth impedances of the first type each have a first impedance value; the first, second, third, and fourth impedances of the second type each have a second impedance value; and the first impedance value is different than the second impedance value.

19. The polyphase network of claim 13, wherein the first, second, third, and fourth impedances of the first type each have a first phase angle characteristic; the first, second, third, and fourth impedances of the second type each have a second phase angle characteristic; and the first phase angle characteristic is different than the second phase angle characteristic.

* * * * *